(12) United States Patent
Sakurai (10) Patent No.: US 6,846,699 B2
(45) Date of Patent: Jan. 25, 2005

(54) SEMICONDUCTOR DEVICE AND METHOD OF MANUFACTURE THEREOF, CIRCUIT BOARD, AND ELECTRONIC INSTRUMENT

(75) Inventor: Kazunori Sakurai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 45 days.

(21) Appl. No.: 09/987,409

(22) Filed: Nov. 14, 2001

(65) Prior Publication Data

US 2002/0079594 A1 Jun. 27, 2002

(30) Foreign Application Priority Data

Dec. 26, 2000 (JP) ........................................ 2000-395111

(51) Int. Cl.[7] ............................................... H01L 21/44
(52) U.S. Cl. ..................................... 438/108; 438/613
(58) Field of Search ................................ 438/411, 461, 438/613, 611, 108, 118, 119; 257/737, 738, 747, 753; 228/180.21, 180.22

(56) References Cited

U.S. PATENT DOCUMENTS 6,051,093 A * 4/2000 Tsukahara .................... 156/298
6,208,525 B1 * 3/2001 Imasu et al. ................. 438/118
2001/0031515 A1 * 10/2001 Miyasaka .................... 438/108

* cited by examiner

*Primary Examiner*—Michael Tokar
*Assistant Examiner*—Lisa Kilday
(74) *Attorney, Agent, or Firm*—Oliff & Berridge, PLC (57) ABSTRACT

A method of manufacturing a semiconductor device comprises a step of mounting a semiconductor chip on a wiring substrate having a base substrate on which are formed interconnecting lines; while melting the base substrate, bumps provided to the semiconductor chip are pressed in, and the bumps are electrically connected to the interconnecting lines.

7 Claims, 6 Drawing Sheets

FIG. 11

SEMICONDUCTOR DEVICE AND METHOD OF MANUFACTURE THEREOF, CIRCUIT BOARD, AND ELECTRONIC INSTRUMENT

Japanese Patent Application No. 2000-395111, filed Dec. 26, 2000, is hereby incorporated by reference in its entirety.

TECHNICAL FIELD

The present invention relates to a semiconductor device and method of manufacture thereof, a circuit board, and an electronic instrument.

BACKGROUND

As one type of CSP (Chip Scale/Size Package) semiconductor device is known the construction in which a semiconductor chip is mounted face down on a substrate (flip-chip connection).

In this case, between the semiconductor chip and the substrate a resin is commonly provide as an underfill material. The resin is provided by being injected between the semiconductor chip and the substrate after mounting, or by being previously applied to the substrate before mounting. However, the step of providing the resin entails an extra process, and makes the manufacturing process of the semiconductor device correspondingly longer.

Moreover, with the development of multi-chip modules in recent years, the configuration of mounting semiconductor chips on both surfaces of a wiring substrate has been developed. However, for this purpose, interconnecting lines must be formed on both surfaces of a substrate, and further for electrical conduction between the interconnecting lines on both surfaces via holes are required, resulting in increased costs and degraded manufacturing processes.

SUMMARY

According to the first aspect of the present invention, there is provided a method of manufacturing a semiconductor device comprising a step of mounting a semiconductor chip on a wiring substrate having a base substrate on which are formed interconnecting lines, and while melting the base substrate, bumps provided to the semiconductor chip are pressed in, and the bumps are electrically connected to the interconnecting lines.

A semiconductor device according to the second aspect of the present invention can be manufactured by the above described manufacturing method.

A semiconductor device according to the third aspect of the present invention comprises:

a semiconductor chip having electrodes on which bumps are formed; and a wiring substrate on which the semiconductor chip is mounted, and having a base substrate on which are formed interconnecting lines having connecting portions electrically connecting to the bumps, wherein the bumps are embedded in the base substrate and electrically connected to the interconnecting lines; and wherein the bumps and the connecting portions are sealed by the base substrate.

A circuit board according to the fourth aspect of the present invention has the above described semiconductor device mounted thereon.

An electronic instrument according to the fifth aspect of the present invention comprises the above described semiconductor device.

DETAILED DESCRIPTION

With this embodiment, the above problems can be solved, and a semiconductor device and method of manufacture thereof allowing semiconductor chip mounting in fewer steps, a circuit board, and an electronic instrument can be provided.

(1) According to this embodiment, there is provided a method of manufacturing a semiconductor device comprising a step of mounting a semiconductor chip on a wiring substrate having a base substrate on which are formed interconnecting lines, and while melting the base substrate, bumps provided to the semiconductor chip are pressed in, and the bumps are electrically connected to the interconnecting lines.

According to this embodiment, while melting the base substrate, the bumps provided to the semiconductor chip are pressed in, and the bumps are electrically connected to the interconnecting lines. By means of this, with for example the wiring substrate having the interconnecting lines formed on one surface of the base substrate, it is simple to mount the semiconductor chips on both sides. Also, for example, since the bumps and the like can be sealed with the melted material of the base substrate, a high reliability semiconductor device can be manufactured in a smaller number of steps.

(2) In this method of manufacture of a semiconductor device:

the interconnecting lines may comprise connecting portions electrically connecting with the bumps, and in the step of electrical connection, the base substrate may be melted, and the bumps and the connecting portions may be sealed with the melted material of the base substrate.

By means of this, electrically connecting the bumps to the connecting portions of the interconnecting lines, and sealing them, can be carried out in a single step.

(3) In this method of manufacture of a semiconductor device:

in the step of electrical connection, the base substrate may be melted, and the melted material of the base substrate may be adhered closely to a surface of the semiconductor chip.

By means of this, since the melted material of the base substrate is adhered to the surface of the semiconductor chip, stress applied to the semiconductor chip can be absorbed by the base substrate.

(4) In this method of manufacture of a semiconductor device:

in the step of electrical connection, the base substrate may be melted by heat.

By means of this, since the base substrate can be melted by means of the heat for electrically connecting the bumps to the interconnecting lines for example, the base substrate can be melted easily.

(5) In this method of manufacture of a semiconductor device:

a thermoplastic resin may be used as the base substrate.

By means of this, further subsequent processing by heat is easy.

(6) In this method of manufacture of a semiconductor device:

in the step of electrical connection, the semiconductor chip may be held by a jig, heat may be applied to the jig to heat at least the bumps of the semiconductor chip, and the jig may be pressed in the direction of the base substrate, whereby the bumps may be pressed into the base substrate.

(7) This method of manufacture of a semiconductor device may further comprise:

a step of mounting another semiconductor chip on the wiring substrate.

(8) This embodiment of the semiconductor device can be manufactured by the above described manufacturing method.

(9) This embodiment of the semiconductor device comprises:

a semiconductor chip having electrodes on which bumps are formed; and a wiring substrate on which the semiconductor chip is mounted, and having a base substrate on which are formed interconnecting lines having connecting portions electrically connecting to the bumps, wherein the bumps are embedded in the base substrate and electrically connected to the interconnecting lines; and wherein the bumps and the connecting portions are sealed by the base substrate.

According to this embodiment, since the bumps and the connecting portions are sealed by the base substrate, it is not necessarily required to provide a resin for sealing other than the wiring substrate, and the number of elements of the device can be reduced. Since the bumps are embedded in the base substrate, the semiconductor device can be made thinner.

(10) In this semiconductor device:

the base substrate may be adhered closely to a surface of the semiconductor chip.

By means of this, stress applied to the semiconductor chip can be absorbed by the base substrate.

(11) In this semiconductor device:

the base substrate may be a thermoplastic resin.

(12) This semiconductor device may further include:

another semiconductor chip mounted on the wiring substrate.

(13) This embodiment of a circuit board has the above described semiconductor device mounted thereon.

(14) This embodiment of an electronic instrument comprises the above described semiconductor device.

The present invention is now described in terms of a number of embodiments, with reference to the drawings. However, the present invention is not limited to these embodiments.

First Embodiment

Figure 1A:
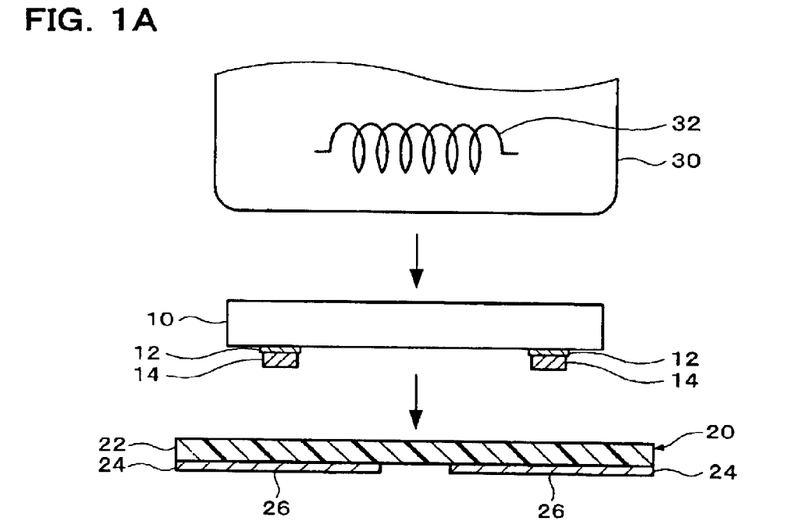
FIGS. 1A to 1C show a first embodiment of the semiconductor device to which the present invention is applied and a method of manufacture thereof.
Figure 1B:
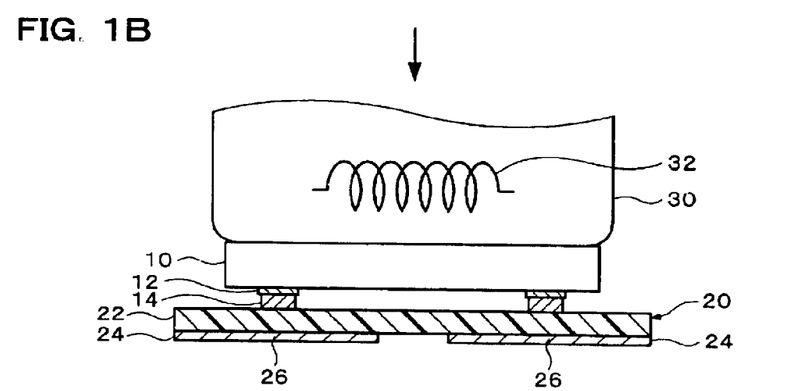
Figure 1C:
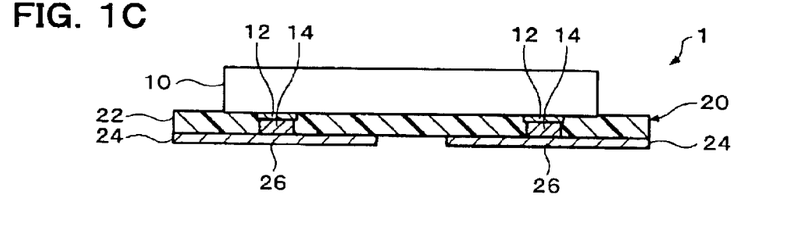

FIGS. 1A to 1C show a method of manufacturing a semiconductor device of the first embodiment to which the present invention is applied. In this embodiment, a semiconductor chip 10 and a wiring substrate 20 are used.

The form of the semiconductor chip 10 may be a rectangular parallelepiped (including a cube), or may be spherical. The semiconductor chip 10 has a plurality of electrodes 12. The electrodes 12 are external electrodes of the circuit elements formed on the semiconductor chip 10, and are pads formed of thin aluminum, copper, or the like. The electrodes 12 are commonly formed on either one surface of the semiconductor chip 10. The electrodes 12 may be formed on the surface of the semiconductor chip 10 inside the active region in which the circuit elements are formed, or may be formed on the outside.

The electrodes 12 may be formed at the extremity of the surface of the semiconductor chip 10. The electrodes 12 may be formed on two parallel sides of the semiconductor chip 10, or on four sides. On the semiconductor chip 10, avoiding at least some of the electrodes 12, a passivation film (not shown in the drawings) is formed. The passivation film can be formed of, for example, $SiO_2$, SiN, a polyimide resin, or the like.

On the electrodes 12 are provided bumps 14. The bumps 14 may be formed of at least one of gold, nickel, copper, silver, tin, and the like. The surface of the bumps 14 may be plated. The bumps 14 may be solder plated. The form of the bumps 14 is not particularly restricted, and may be squashed flat, or may project, or may have a ball shape. The height of the bumps 14 is not particularly restricted. The bumps 14 may be formed by electroplating or electroless plating, or may be formed in a ball shape by melting a bonding wire. In the example shown in the drawings, the bumps 14 are single-step, but may equally be multiple step.

The wiring substrate 20 includes a base substrate 22, and the plurality of interconnecting lines 24 formed on the base substrate 22. The plurality of interconnecting lines 24 is supported by the base substrate 22, and may be formed, for example, on one surface of the base substrate 22. The wiring substrate 20 may be a three-layer substrate with the interconnecting lines 24 formed on the base substrate 22 with an adhesive (not shown in the drawings) interposed, or it may be a two-layer substrate in which the interconnecting lines 24 are formed on the base substrate 22 without an adhesive.

The interconnecting lines 24 refer to portions that provide electrical connection between at least two points, and the plurality of individually formed interconnecting lines 24 may be referred to as an interconnecting pattern. The interconnecting lines 24 may be formed by laminating any of copper (Cu), chromium (Cr), titanium (Ti), nickel (Ni), and titanium-tungsten (Ti-W), or may be formed of a single layer of any of these. In this case, the interconnecting lines 24 are desirably plated with solder, tin, gold, nickel, or the like. The interconnecting lines 24 can be formed by etching, plating treatment, or sputtering or the like. For example, a copper foil may be adhered to the base substrate 22 by heat and pressure, a copper pattern formed by photoetching, and then the interconnecting lines 24 formed by further plating with tin or gold or the like.

The interconnecting lines 24 have a plurality of connecting portions 26. The connecting portions 26 are parts of the interconnecting lines 24 for electrical connection to the semiconductor chip 10. The connecting portions 26 are electrically connected to the bumps 14. The connecting portions 26 may be lands. The connecting portions 26 are plated with solder or the like to enable a good connection.

The base substrate 22 is desirably formed of an organic material. The base substrate 22 is desirably formed of a material including a resin. The base substrate 22 may be of a thermoplastic resin. By means of a thermoplastic resin, after once processing as a wiring substrate 20, further subsequent processing is easy. Alternatively, the base substrate 22 may be of a thermosetting resin. Even if a thermosetting resin, if for example the interconnecting lines 24 are supported while in a semi-cured state, further subsequent processing is possible.

The base substrate 22 may be of a resin in which conducting particles (not shown in the drawings) are included. The base substrate 22 may be an anisotropic conductive film (ACF). The bumps 14 are electrically connected to the connecting portions 26 with the conducting particles interposed. If an anisotropic conductive film is used, it is electrically conducting only in the direction in which the conducting particles are squashed, and is not conducting in other directions. Therefore, even when the plurality of interconnecting lines 24 is supported by the anisotropic conductive film, the interconnecting lines 24 are not mutually electrically conducting.

As the material of the base substrate 22 may be used a liquid crystal polymer (LCP). A liquid crystal polymer exhibits a liquid crystal state when melted. Compared with other polymers, it is characterized by reduced dimensional variation due to temperature or humidity.

For example, as the wiring substrate 20 may be used a flexible copper lamination having the liquid crystal polymer film BIAC (registered trade mark) on which a copper foil (the interconnecting lines 24) is formed. By means of this, the water absorption ratio is reduced, and even under conditions of high humidity, high dimensional stability can be maintained. Furthermore, since the coefficient of linear thermal expansion is arranged to be almost the same as that of copper foil (the interconnecting lines 24), warping due to temperature variations is eliminated.

As shown in FIG. 1A, the semiconductor chip 10 opposes the base substrate 20. As shown in the drawing, when a wiring substrate 20 having interconnecting lines 24 on one surface is used, the semiconductor chip 10 opposes the other surface of the wiring substrate 20. The semiconductor chip 10 has the surface on which the electrodes 12 are formed opposing the wiring substrate 20. The semiconductor chip 10 is subjected to so-called face-down mounting.

The bumps 14 of the semiconductor chip 10 are aligned with the connecting portions 26 of the interconnecting lines 24. For example, the wiring substrate 20 may be mounted on a stage not shown in the drawings, and the semiconductor chip 10 held in a jig 30 for the alignment. The jig 30 may hold the surface of the semiconductor chip 10 opposite to the surface on which the electrodes 12 are formed by suction. In the example shown in the drawings, the jig 30 has an internal heater 32 supplying heat from a heat source.

Next, as shown in FIG. 1B, the bumps 14 of the semiconductor chip 10 are pressed into the base substrate 22 while melting the base substrate 22. To express this in a different order, the base substrate 22 is melted while pressing the bumps 14 of the semiconductor chip 10 into the base substrate 22.

For melting the base substrate 22, energy concordant with the mechanism of melting of the base substrate 22 may be applied. The energy may be radiation (including visible light, ultraviolet radiation, electron beam, X-rays, and so on), or heat or the like. In the example shown in the drawings, the base substrate 20 is melted by heat. In this case, the base substrate 22 may be heated and melted by the heater 32 of the jig 30. The heater 32 heats at least the bumps 14 of the semiconductor chip 10.

In order to press in the bumps 14 of the semiconductor chip 10, at least one of the semiconductor chip 10 and base substrate 22 is pressed against the other. For example, with the jig 30 pressed against the semiconductor chip 10, it may be pressed against the base substrate 22. If the jig 30 is used, the melting of the base substrate 22, and the pressing in of the bumps 14 of the semiconductor chip 10 can be carried out simultaneously.

In this way, as shown in FIG. 1C, the bumps 14 are pressed into the melted base substrate 22, and are electrically connected to the interconnecting lines 24. By means of this, compared with the case in which the bumps 14 are mechanically pressed into the base substrate 22 without melting the base substrate 22, the electrical connection of the bumps 14 to the interconnecting lines 24 can be achieved with the application of a lower pressure. Furthermore, by melting the base substrate 22, because the bumps 14 push aside the melted material of the base substrate 22, a more definite connection to the connecting portions 26 is achieved.

The bumps 14 and connecting portions 26 may be sealed by the base substrate 22. In more detail, on the periphery of the bumps 14 and the connecting portions 26, the melted material of the base substrate 22 is provided to be in intimate contact therewith. When the bumps 14 and connecting portions 26 are electrically connected, the melted material of the base substrate 22 flows to fill the gap on the periphery thereof. By means of this, electrical short circuits are prevented, and an improvement in the resistance of the device to moisture is implied.

The surface of the semiconductor chip 10 may be in intimate contact with the base substrate 22. That is to say, the semiconductor chip 10 may be pressed into the base substrate 22, and the melted material of the base substrate 22 may form an intimate contact with the surface of the semiconductor chip 10. In the example shown in the drawings, the semiconductor chip 10 is in intimate contact with the base substrate 22 on the surface on which the electrodes 12 are formed. It should be noted that the semiconductor chip 10 may be partially embedded in the base substrate 22, or may be not embedded.

By means of this, between the semiconductor chip 10 and the interconnecting lines 26 can be seamlessly filled with the resin or similar material of the base substrate 22. Therefore, stress concentrated on the bumps 14 (or connecting portions 26 of the interconnecting lines 24) can be distributed over the whole surface of the semiconductor chip 10 by the base substrate 22. In other words, stress applied to the semiconductor chip 10 can be absorbed by the base substrate 22.

It should be noted that the thickness of the base substrate 22 may be more than the distance in the thickness direction by which the bumps 14 project from the surface of the semiconductor chip 10 having the electrodes 12. By means of this, a part of the semiconductor chip 10 can be embedded in the base substrate 22, and the intimate contact between the semiconductor chip 10 and the base substrate 22 can be made easier to achieve.

This embodiment of the semiconductor device is now described. It should be noted that in the following description, description which would duplicate content described in the method of manufacture is omitted.

As shown in FIG. 1C, a semiconductor device 1 includes a semiconductor chip 10 having a plurality of electrodes 12 and bumps 14 formed on the electrodes 12, and a wiring substrate 20 in which the plurality of interconnecting lines 24, having electrical connecting portions 26 with the bumps 14, are formed on the base substrate 22. In the example shown in the drawings, the interconnecting lines 24 are formed on one surface of the base substrate 22. In other words, the wiring substrate 20 has a surface on the side of the base substrate 22 and a surface on the side of the interconnecting lines 24.

In the example shown in the drawings, the semiconductor chip 10 is mounted on the surface of the wiring substrate 20 on the side of the base substrate 22. Then the bumps 14 enter the base substrate 22 and are electrically connected to the interconnecting lines 24. The bumps 14 are connected to the connecting portions 26 on the surface of the base substrate 22 opposite to that on which the semiconductor chip 10 is provided. That is to say, the bumps 14 pass through the base substrate 22. The semiconductor chip 10 is subjected to so-called face-down mounting to the interconnecting lines 24.

The bumps 14 and connecting portions 26 are sealed by the base substrate 22. That is to say, both are in intimate contact with the solidified material of the base substrate 22. The base substrate 22 may be in intimate contact with the surface of the semiconductor chip 10 having the electrodes 12. In the example shown in the drawings, the surface of the base substrate 22 is flat outside the area in which the semiconductor chip 10 is provided, but in addition may be raised so as to cover at least a part of the extremity of the semiconductor chip 10.

By means of this, the bumps 14 and connecting portions 26 are sealed by the base substrate 22, and therefore it is not necessarily required to provide a sealing resin separate from the wiring substrate 20, and the number of components in the device is reduced. Since the bumps 14 enter the base substrate 22, the semiconductor device can be made thinner.

It should be noted that the package form of this embodiment of the semiconductor device may be termed a BGA (Ball Grid Array) or CSP (Chip Size/Scale Package) As the wiring substrate 20, a COF (Chip On Flex/Film) substrate or COB (Chip On Board) substrate may be used.

Second Embodiment

Figure 2:
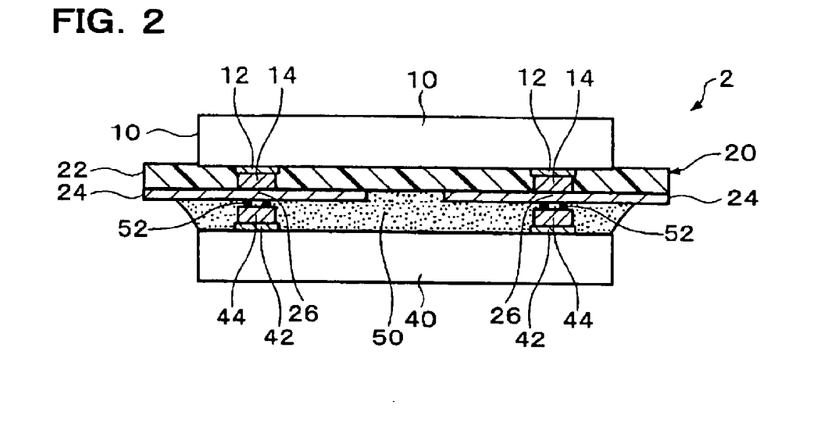
FIG. 2 shows a second embodiment of the semiconductor device to which the present invention is applied.
Figure 3:
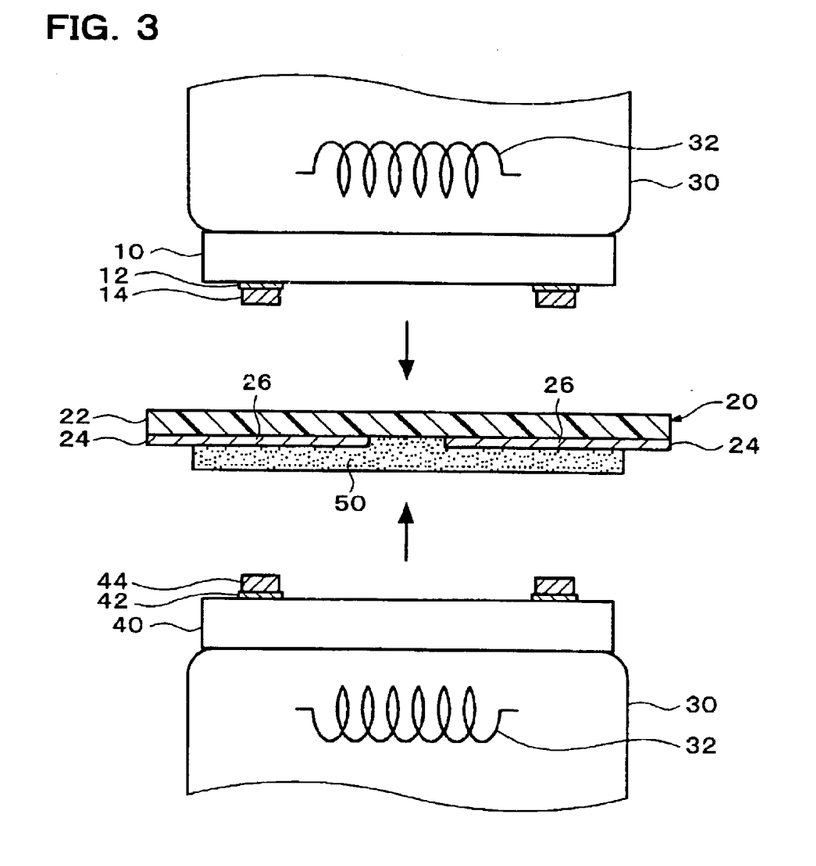
FIG. 3 shows the method of manufacture of the second embodiment of the semiconductor device to which the present invention is applied.

FIGS. 2 and 3 show a second embodiment of the semiconductor device to which the present invention is applied. In this embodiment, an example of a semiconductor device and method of manufacture thereof is described, in which the mounting configuration of the above described semiconductor chip is applied to a multi-chip module configuration. It should be noted that in the following description, as far as possible, content described in the first embodiment can be applied.

A semiconductor device 2 includes first and second semiconductor chips 10 and 40, and a wiring substrate 20. The first semiconductor chip 10 is as already described, and the second semiconductor chip 40 has a plurality of electrodes 42, and on the electrodes 12 are formed bumps 44. In the example shown in the drawing, the wiring substrate 20 has interconnecting lines 24 formed on one surface of the base substrate 22.

The second semiconductor chip 40 is subjected to face-down mounting on the surface of the wiring substrate 20 on the side of the interconnecting lines 24. As for example shown in FIG. 2, the second semiconductor chip 40 may be adhered to the wiring substrate 20 with an anisotropic conducting material 50 including conducting particles 52 interposed. In this case, the bumps 44 are electrically connected to the interconnecting lines 24 through the conducting particles 52.

The second semiconductor chip 40 may be a "mirror chip" of the first semiconductor chip 10. Also, the bumps 44 may be connected to the connecting portions 26 to which the bumps 14 of the first semiconductor chip 10 are electrically connected.

By means of this, for example, when the first and second semiconductor chips 10 and 40 are memory, from the same arrangement of external terminals (not shown in the drawings), data can be read out from or written to the memory cell at the same address in each memory. Furthermore, for the first and second semiconductor chips 10 and 40, by separating only the chip select terminal connections, the same external terminal arrangement can be used, and at least two (a plurality is possible) semiconductor chips can be separately controlled.

According to this embodiment of the semiconductor device, since the second semiconductor chip 40 is mounted on the surface on which the interconnecting lines 24 are formed, the semiconductor chips 10 and 40 can be simply mounted on both surfaces. Furthermore, the first semiconductor chip 10 has the bumps 14 embedded in the base substrate 22, and therefore the semiconductor device 2 can be made thinner. Therefore, a low-cost and compact multi-chip module can be provided.

FIG. 3 shows a method of manufacture of this embodiment of the semiconductor device. The first and second semiconductor chips 10 and 40 may be separately mounted on the wiring substrate 20, or may be mounted approximately simultaneously.

If the first and second semiconductor chips 10 and 40 are mounted approximately simultaneously, since pressure can be applied from both sides of the connecting portions 26 of the interconnecting lines 24, the process can be completed without applying excessive stress to the interconnecting lines 24. If the mounting is simultaneous, the mounting time can be reduced, and therefore the manufacturing efficiency is increased.

When the first and second semiconductor chips 10 and 40 are mounted separately, the first semiconductor chip 10 may be mounted first. If this is done, the second semiconductor chip 40 can be mounted after confirming the connection of the bumps 14 to the connecting portions 26, and therefore the occurrence of faults can be reduced.

Third Embodiment

FIGS. 4 to 8 show the third embodiment of the semiconductor device to which the present invention is applied. In this embodiment, a semiconductor device is shown in which the semiconductor chip mounting configuration shown in the first embodiment is applied to a multi-chip module configuration. It should be noted that in the following description, as far as possible, content described in the above described embodiments can be applied.

FIRST EXAMPLE

Figure 4:
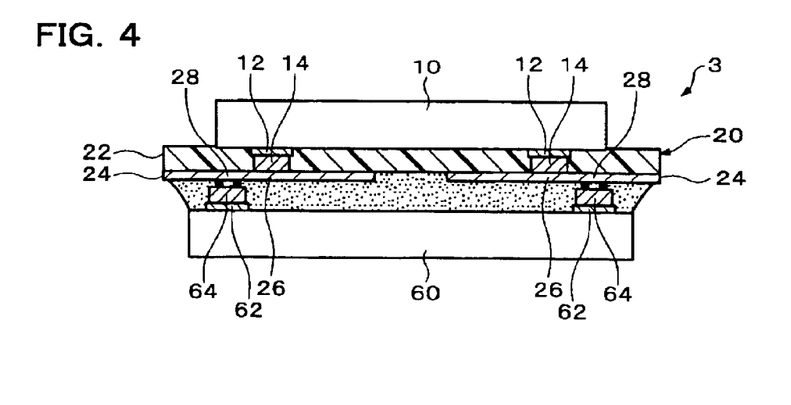
FIG. 4 shows a shows a first example of the third embodiment of the semiconductor device to which the present invention is applied.

FIG. 4 shows a first example of this embodiment of the semiconductor device. A semiconductor device 3 includes first and second semiconductor chips 10 and 60, and a wiring substrate 20. In the first example, the difference from the example shown in the second embodiment is that the external forms of the first and second semiconductor chips 10 and 60 are different from each other.

The second semiconductor chip 60 may be larger in outline than the first semiconductor chip 10, or may be smaller. Bumps 64 on electrodes 62 are electrically connected to the interconnecting lines 24 by connecting portions 28 in positions different from those of the connecting portions 26 connecting to the first bumps 14 of the semiconductor chip 10.

In the example shown in the drawings, the external terminals of the wiring substrate 20 are omitted. The external terminals are connected to circuit elements (for example a liquid crystal panel or motherboard), not shown in the drawings. For example, a part of the wiring substrate may be extended, to form external connections. That is to say, part of the interconnecting lines 24 supported on the base substrate 22 may be connector leads.

SECOND EXAMPLE

Figure 5:
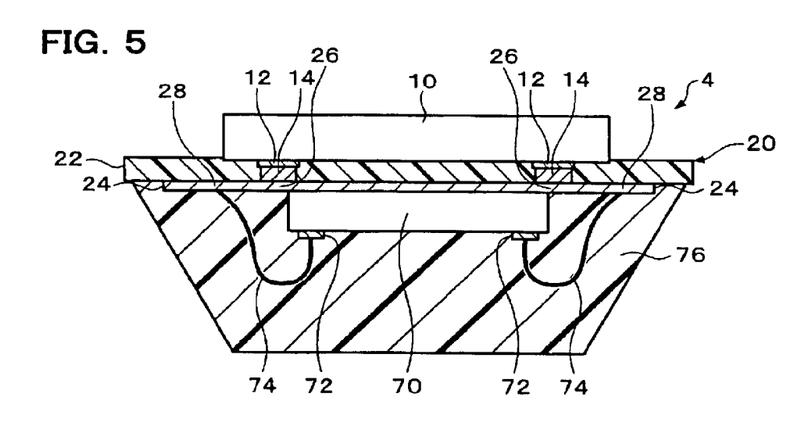
FIG. 5 shows a second example of the third embodiment of the semiconductor device to which the present invention is applied.

FIG. 5 shows a second example of this embodiment of the semiconductor device. A semiconductor device 4 includes first and second semiconductor chips 10 and 70, and the second semiconductor chip 70 is sealed with a resin 76.

The second semiconductor chip 70 is mounted face up on the wiring substrate 20. Electrodes 72 are connected to the connecting portions 28 with wires 74 interposed. The resin 76 may be a molding resin that can be used with a die. It should be noted that in the example shown in the drawing again, the external terminals of the wiring substrate 20 are omitted.

THIRD EXAMPLE

Figure 6:
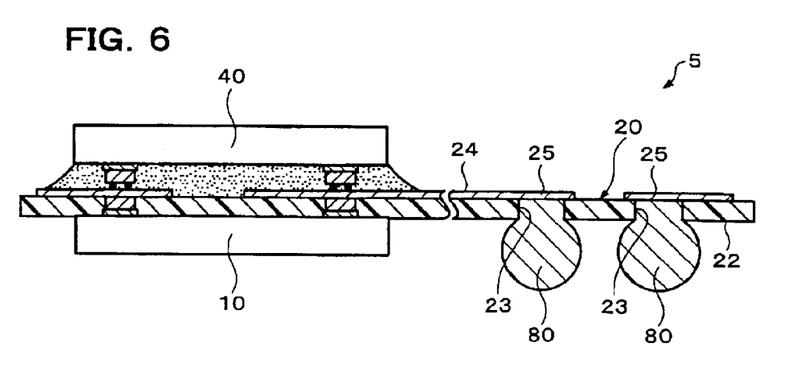
FIG. 6 shows a third example of the third embodiment of the semiconductor device to which the present invention is applied.
Figure 7:
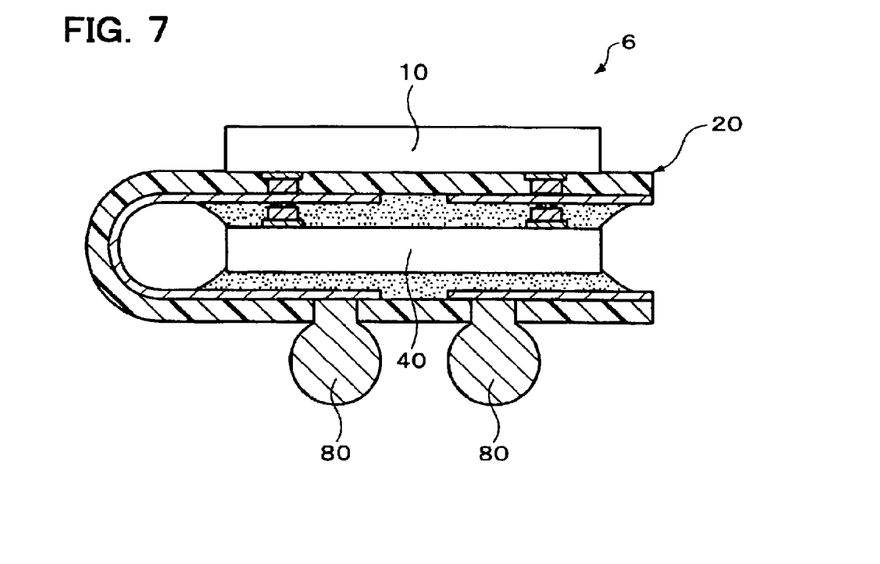
FIG. 7 shows the third example of the third embodiment of the semiconductor device to which the present invention is applied.

FIGS. 6 and 7 show a third example of this embodiment of the semiconductor device. A semiconductor device 5 includes first and second semiconductor chips 10 and 40 and a wiring substrate 20. On the wiring substrate 20 is provided a plurality of solder balls 80 as external terminals.

The wiring substrate 20 has a region in which the first and second semiconductor chips 10 and 40 are mounted, and a region in which the plurality of solder balls 80 is provided. By providing the regions separately, stresses applied to the semiconductor chip or the like during the manufacturing process can be limited. The mounting region of the semiconductor chips and the mounting region of the solder balls 80 may be of approximately the same size. By virtue of this, the two regions may be overlaid.

It should be noted that for a single region in which the solder balls 80 are provided, two or more semiconductor chip mounting regions may be provided. By folding the regions in which the semiconductor chips are mounted from a plurality of directions, a semiconductor device can be manufactured with approximately the same plan area as the region in which the solder balls 80 are provided.

The solder balls 80 may, as shown in the drawing project from the base substrate 22 side of the wiring substrate 20, or may project from the interconnecting lines 22 side of the wiring substrate 20. In the case of projecting on the base substrate 22 side, the solder balls 80 project through penetrating holes 23 in the base substrate 22. The penetrating holes 23 are formed in a portion overlying the interconnecting lines 24. The solder balls 80 can be provided by disposing preformed solder on lands 25 which are a portion of the interconnecting lines 24, and forming in a reflow process.

Alternatively, without explicitly providing balls, the solder balls 80 may be provided by applying solder to the circuit elements. The semiconductor chip (not shown in the drawings) may be mounted in the region in which the solder balls 80 are provided.

A semiconductor device 6 shown in FIG. 7 has a semiconductor device 5 in folded form. In more detail, the regions in which the semiconductor chips 10 and 40 are mounted are overlaid in such a way that in the region in which solder balls 80 are provided, the solder balls 80 project to the outside. By means of this, a compact and high density semiconductor device can be provided.

FOURTH EXAMPLE

Figure 8:
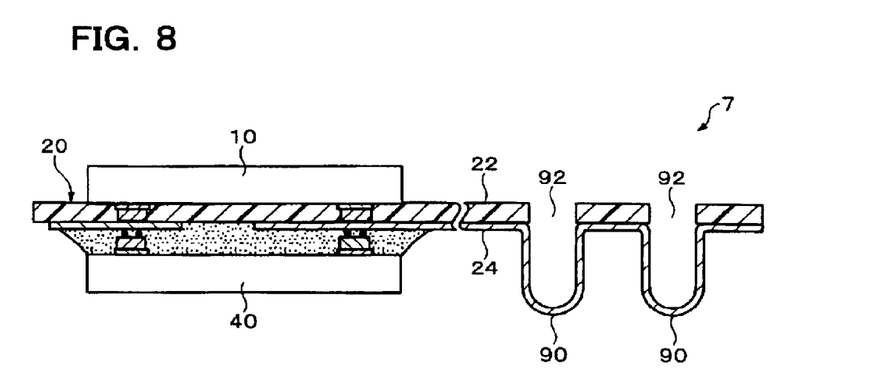
FIG. 8 shows a fourth example of the third embodiment of the semiconductor device to which the present invention is applied.

FIG. 8 shows a fourth example of this embodiment of the semiconductor device. A semiconductor device 7 has a part of the interconnecting lines 24 in a bent portion 90, constituting a plurality of external terminals.

The bent portion 90 projects from the surface of the base substrate 22. In more detail, the interconnecting lines 24 have their ends in the direction of projecting from the base substrate 22 bent. In the base substrate 22 in the position of the bent portion 90, penetrating holes 92 may be formed. By means of this, for example a convex form jig can be passed through the penetrating holes 92 to form the convex bent portion 90 in the interconnecting lines 24.

In FIG. 8, the bent portion 90 projects from the wiring substrate 20 on the side of the interconnecting lines 24, but it may equally project through the penetrating holes 92 from the side of the base substrate 22. Since the external terminals are constituted using a portion of the interconnecting lines 24, the number of components of the semiconductor device can be reduced.

The bent portion 90 may be formed by a central portion of a part of the interconnecting lines 24 (for example lands) projecting. In this case, the inside of the bent portion 90 may be filled with conducting paste or the like. Since the external terminals are formed of the interconnecting lines 24 (for example copper) which are harder than solder, the temperature cycle reliability of the device is improved.

It should be noted that this example can be applied to replace the solder balls 80 in all embodiments having the above described solder balls 80.

According to the configuration of the above described multi-chip module, since the first semiconductor chip 10 is mounted on the side of the wiring substrate 20 of the base substrate 22, another semiconductor chip (the second semiconductor chip 60 or 70) can be mounted on the side on which the interconnecting lines 24 are formed, in a variety of configurations, and in a simple way. Moreover, the bumps 14 of the semiconductor chip 10 are embedded in the base substrate 22, and therefore the semiconductor device can be made more compact. Other benefits are as described for the above described embodiments.

Figure 9:
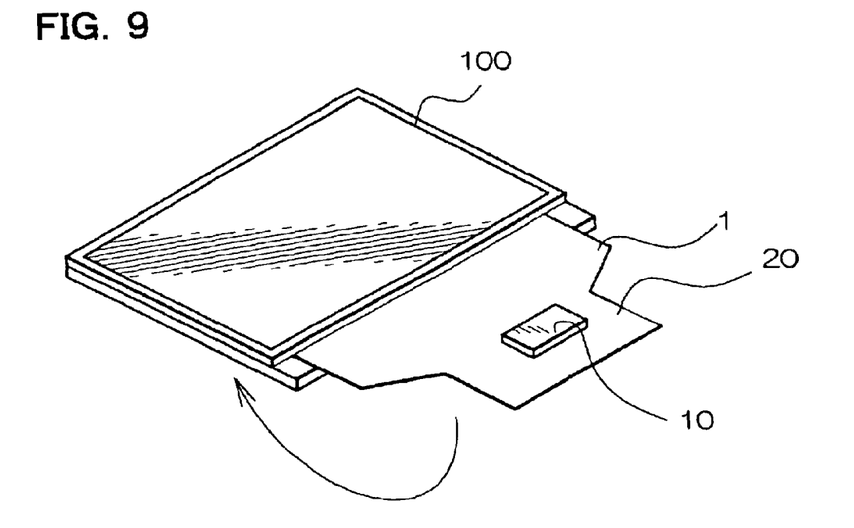
FIG. 9 shows a circuit board on which the embodiment of the semiconductor device to which the present invention is applied is mounted.

FIG. 9 shows an embodiment of a circuit board to which the present invention is applied. As shown in FIG. 9, the above described semiconductor device is electrically connected to the circuit board. The circuit board may, for example, be a liquid crystal panel 100. The semiconductor device is has the form of stamping out the outline surrounding the plurality of interconnecting lines 24 in the base substrate 22 of a tape form semiconductor device.

Figure 10:
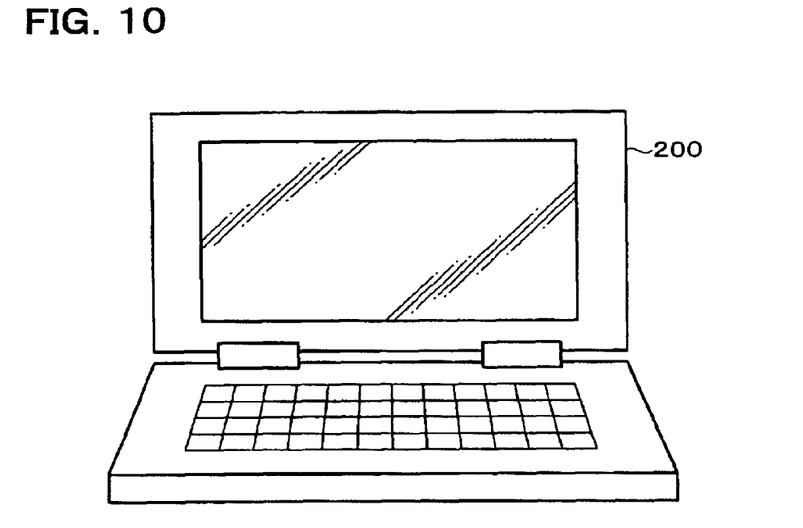
FIG. 10 shows an electronic instrument having the embodiment of the semiconductor device to which the present invention is applied.
Figure 11:
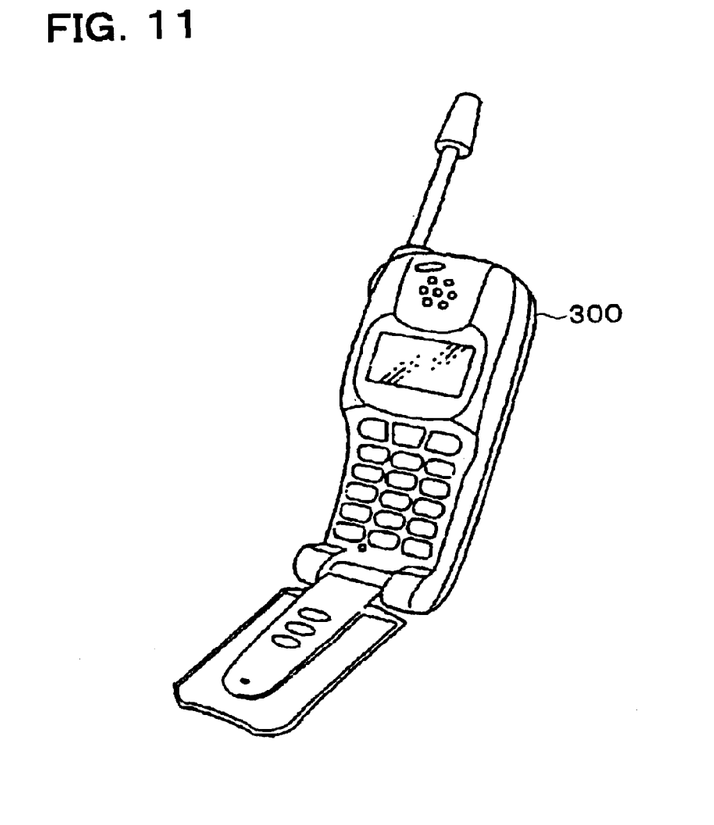
FIG. 11 shows an electronic instrument having the embodiment of the semiconductor device to which the present invention is applied.

As an electronic instrument having the semiconductor device to which the present invention is applied, in FIG. 10 is shown a notebook personal computer 200. In FIG. 11, is shown a mobile telephone 300. This mobile telephone 300 has the circuit board (liquid crystal panel 100) to which the present invention is applied.

What is claimed is:

1. A method of manufacturing a semiconductor device, the method comprising:

mounting a first semiconductor chip on a first surface of a base substrate so that bumps on the first semiconductor chip are in contact with the first surface of the base substrate, then heating at least the bumps and pressing the first semiconductor chip toward the base substrate so that the base substrate is melted and the bumps are pushed into the base substrate from the first surface through the base substrate to a second surface opposite to the first surface, and then electrically connecting the bumps to interconnecting lines formed on the second surface of the base substrate; and mounting a second semiconductor chip on the second surface of the base substrate so that the second semiconductor chip is electrically connected to the interconnecting lines.

2. The method of manufacturing a semiconductor device as defined in claim 1, further comprising:

providing an adhesive material between the second semiconductor chip and the base substrate.

3. The method of manufacturing a semiconductor device as defined in claim 1, wherein the first and second semiconductor chips are mounted nearly at the same time.

4. The method of manufacturing a semiconductor device as defined in claim 1, wherein the interconnecting lines comprise connecting portions electrically connecting with the bumps, and wherein in the step of mounting the first semiconductor chips, the base substrate is melted, so that connections of the bumps and the connecting portions are sealed with the melted material of the base substrate.

5. The method of manufacturing a semiconductor device as defined in claim 1, wherein the melted material of the base substrate is adhered closely to a surface of the first semiconductor chip.

6. The method of manufacturing a semiconductor device as defined in claim 1, wherein a thermoplastic resin is used as the base substrate.

7. A semiconductor device manufactured by the manufacturing method as defined in claim 1.

* * * * *